(12) United States Patent
Brox et al.

(10) Patent No.: US 6,310,793 B1
(45) Date of Patent: Oct. 30, 2001

(54) SEGMENTED WORD LINE ARCHITECTURE FOR DIVIDING UP A WORD LINE INTO A PLURALITY OF BANKS FOR CELL ARRAYS HAVING LONG BIT LINES

(75) Inventors: Martin Brox, München; Karl-Peter Pfefferl, Höhenkirchen-Siegertsbrun, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/663,583

(22) Filed: Sep. 18, 2000

(30) Foreign Application Priority Data

Sep. 17, 1999 (DE) .............................................. 199 44 738

(51) Int. Cl.⁷ ........................................................ G11C 5/02
(52) U.S. Cl. ................................................ 365/51; 365/63
(58) Field of Search ........................... 365/51, 63, 230.03

(56) References Cited

U.S. PATENT DOCUMENTS 5,966,315 * 10/1999 Muller et al. ............................ 365/51
6,091,660 * 7/2000 Sasaki et al. ..................... 365/230.03

* cited by examiner

*Primary Examiner*—Trong Phan
(74) *Attorney, Agent, or Firm*—Herbert L. Lerner; Laurence A. Greenberg; Werner H. Stemer

(57) ABSTRACT

The segmented word line architecture has two master word lines, to which sub-word lines are alternately allocated. Two memory banks can thus be alternately assigned to the sub-word lines.

4 Claims, 2 Drawing Sheets

SEGMENTED WORD LINE ARCHITECTURE FOR DIVIDING UP A WORD LINE INTO A PLURALITY OF BANKS FOR CELL ARRAYS HAVING LONG BIT LINES

BACKGROUND OF THE INVENTION

1. Field of the Invention

The present invention relates to a segmented word line architecture for dividing up a word line into a plurality of banks for cell arrays having long bit lines. The architecture has a master word line which can be decoded out using address bits to form a plurality of sub-word lines.

FIG. 4 of the drawing shows a memory cell array 1 having schematically indicated word lines WL and bit lines BL, in the center of which a Rambus interface or "SPINE" 2 runs, which accommodates, in particular, logic and data I/O elements. In the case of an x16 RDRAM, the data interface between this memory cell array 1 and the Rambus interface 2 has a width of 128 bits, as is likewise schematically shown in FIG. 4.

Data routing which is distributed over the memory cell array 1—the vertical data routing in FIG. 4—that is to say data routing in the direction of the bit lines BL, ensures that the horizontal wiring, i.e. the wiring in the direction of the word line WL, can be kept down, which means that little chip area is required.

However, besides a long data length of 128 or 256 or 512 bits, RDRAMs also require a large number of memory banks. This is shown schematically in FIG. 5 for a 256 bits/bit line architecture, in which eight memory banks "Bank 0", "Bank 1", . . . "Bank 7" having memory cells connected to word lines WL and bit lines BL (cf. "Bank 0", for example) form a x32 core.

If a 512 bits/bit line architecture, whose structure is shown schematically in FIG. 6, is used instead, the individual memory banks can no longer be mounted together as in the case of the 256 bits/bit line architecture (cf. FIG. 5). Instead, four memory banks in each case are now provided next to one another, which significantly increases the complexity for the horizontal wiring using tristate buffers 3, and so on. This means that the inherently present advantage of less chip area in the 512 bits/bit line architecture as compared with the 256 bits/bit line architecture is once more lost.

There are already so-called segmented word lines, in the case of which a master word line MWL in a higher metal plane is allocated to a plurality of sub-word lines SWL which are routed in lower metal planes and have a bit width of four bits, for example. Decoding elements 5 are used to decode out the master word line MWL using two additional address bits ADD supplied to the decoding elements 5 to form the sub-word line SWL.

SUMMARY OF THE INVENTION

In view of the foregoing, it is the object of the invention to provide a segmented word line architecture which overcomes the above-noted deficiencies and disadvantages of the prior art devices and methods of this kind, and which permits the horizontal wiring to be kept down for 512 and more bits per bit line.

With the above and other objects in view there is provided, in accordance with the invention, a CLAIM 1, A segmented word line architecture for dividing up a word line into a plurality of memory banks for memory cell arrays having long bit lines, comprising:

a plurality of memory banks respectively having a first logic state or a second logic state;

a first master word line which can be decoded out using address bits to form a plurality of sub-word lines;

a second master word line which can be decoded out identically to the first master word line to form a plurality of sub-word lines;

the first and second master word lines in a memory cell array being associated to form a respective master word line pair; and the first master word line being connected via the sub-word lines thereof to the memory banks having the first logic state, and the second master word line being connected via the sub-word lines thereof to the memory banks having the second logic state, such that the memory banks having the first and the second logic state are accommodated alternately in a word line direction.

In accordance with an added feature of the invention, individual addressing elements are respectively connected between the master word lines and the sub-word line.

In accordance with an additional feature of the invention, the first and second master word lines are respectively allocated a plurality of segments of the sub-word line.

In accordance with a concomitant feature of the invention, AND gates are connected between the individual master word lines and the associated sub-word lines.

In other words, the above-mentioned objects are satisfied with a segmented word line architecture of the type mentioned in the introduction which is improved as follows:

the master word line is allocated an additional master word line, so that the master word lines in a memory cell array form respective master word line pairs;

the additional master word line can be decoded out in the same way as the master word line to form a plurality of sub-word lines; and one master word line is connected via its sub-word lines to memory banks having one logic state ("0", for example), and the other master word line is connected via its sub-word lines to memory banks having the other logic state ("1", for example), so that the memory banks having one and the other logic state can be accommodated alternately in the word line direction.

With the segmented word line architecture according to the invention, two memory banks can thus be alternately accommodated horizontally by doubling the number of master word lines as compared with the prior art to date. Hence, one master word line is provided for a bank "0" and another master word line is provided for a bank "1" in each case. The sub-word lines can be of relatively short design, which means that the complexity for the horizontal wiring can also be kept down in this case.

The invention thus advantageously makes it possible to produce two respective memory banks in the word line direction, whose logic state is alternately "0" and "1".

Other features which are considered as characteristic for the invention are set forth in the appended claims.

Although the invention is illustrated and described herein as embodied in a segmented word line architecture for dividing up a word line into a plurality of banks for cell arrays having long bit lines, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Identical and functionally equivalent components and features are identified with the same reference symbols throughout the figures. Reference is had to the description of FIGS. 4 to 7 in the introductory text above.

DESCRIPTION OF THE PREFERRED EMBODIMENTS

Figure 1:
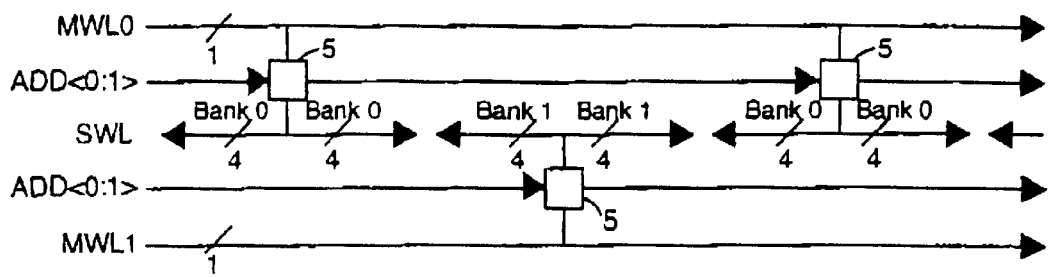
FIGS. 1 and 2 are schematic illustrations of segmented word line architectures in accordance with the invention.
Figure 2:
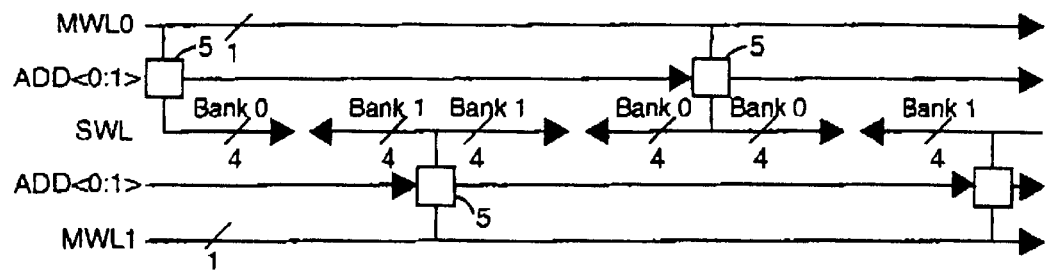
Figure 7:
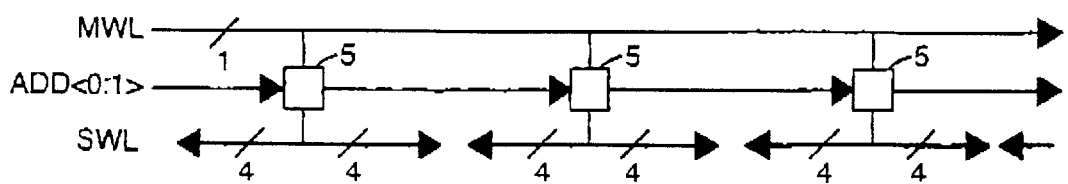
FIG. 7 is a schematic view of a conventional segmented word line architecture.

Referring now to the figures of the drawing in detail which illustrate the invention, and first, particularly, to FIGS. 1 and 2 thereof, there is seen a segmented word line architecture. Two master word lines WL0 and WL1 are provided which are allocated memory banks 0 (master word line MWL0) and memory banks 1 (master word line MWL1) via a respective sub-word line SWL. The connection between the master word lines MWL0 and MWL1 and the sub-word line can be controlled via addressing elements 5, as in the conventional configuration shown in FIG. 7. Respective master word lines MWL0 and MWL1 can thus be decoded using these addressing elements 5 to form the memory banks 0 and 1 in the sub-word line SWL.

FIGS. 1 and 2 show two different variants for the arrangement of these addressing elements 5: in the exemplary embodiment of FIG. 1, each addressing element 5 is allocated two memory segments, while, in the exemplary embodiment of FIG. 2, only one memory segment is assigned to a first addressing element 5.

Figure 3:
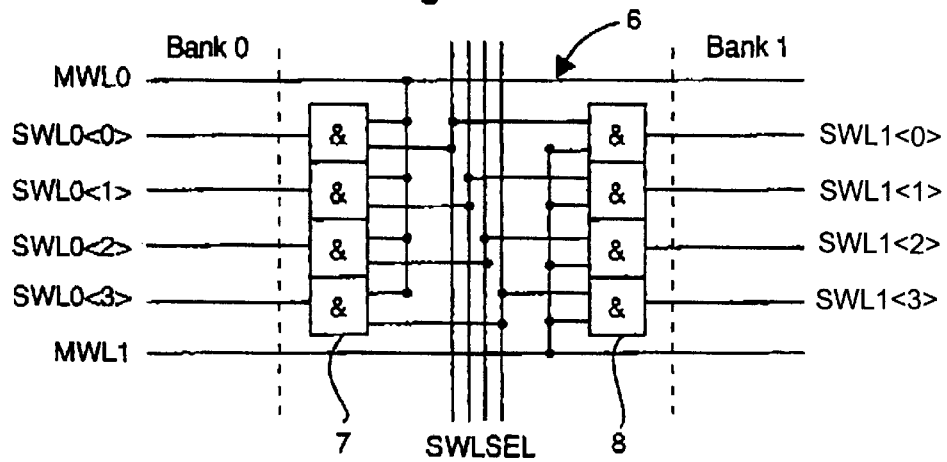
FIG. 3 is a further schematic illustration of a segmented word line architecture according to the invention in which two master word lines are allocated a plurality of sub-word lines via AND gates.
Figure 4:
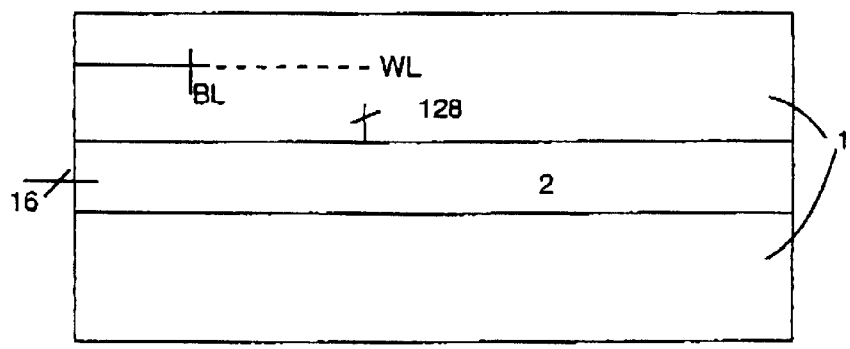
FIG. 4 is a diagrammatic view of a memory cell array in an x16 RDRAM.
Figure 5:
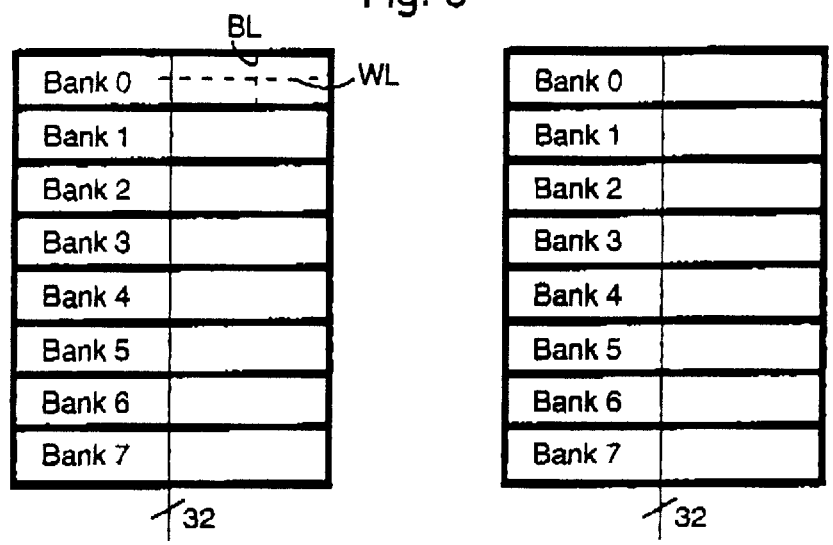
FIG. 5 is a diagram showing a 256 bits/bit line architecture.
Figure 6:
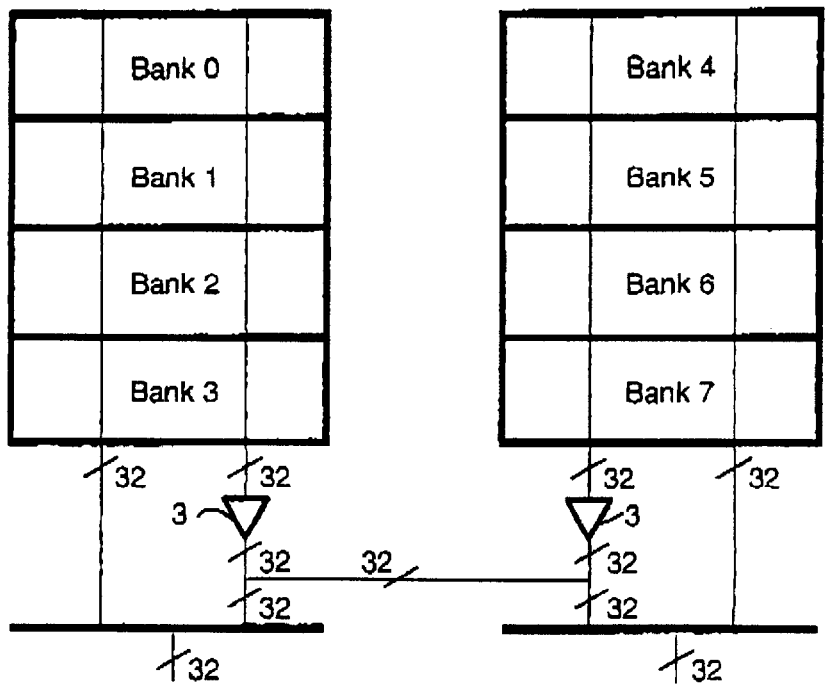
FIG. 6 is a diagram showing a 512 bits/bit line architecture.

FIG. 3 shows a further exemplary embodiment of the segmented word line architecture according to the invention. Here, a sub-word line controller 6 comprising AND gates 7 and 8 is situated between memory cell banks 0 and 1. The AND gates are respectively connected to the master word line MWL0 and to the master word line MWL1. The AND gates 7 and 8 can be driven via sub-word line selection lines SWLSEL, so that the AND gates 7 and 8 can be used to decode out a plurality of sub-word lines SWL0 and SWL1 from the main word lines MWL0 and MWL1.

The segmented word line architecture according to the invention makes it possible to produce two memory banks "0" and "1" in the word line direction, which means that a large number of memory banks can be accommodated with a relatively low space requirement on the chip and without any great complexity for the horizontal wiring.

We claim:

1. A segmented word line architecture for dividing up a word line into a plurality of memory banks for memory cell arrays having long bit lines, comprising:

a plurality of memory banks respectively having a first logic state or a second logic state;

a first master word line which can be decoded out using address bits to form a plurality of sub-word lines;

a second master word line which can be decoded out identically to said first master word line to form a plurality of sub-word lines;

said first and second master word lines in a memory cell array being associated to form a respective master word line pair; and said first master word line being connected via said sub-word lines thereof to said memory banks having the first logic state, and said second master word line being connected via said sub-word lines thereof to said memory banks having the second logic state, such that said memory banks having the first and the second logic state are accommodated alternately in a word line direction.

2. The segmented word line architecture according to claim 1, which comprises individual addressing elements respectively connected between said master word lines and said sub-word line.

3. The segmented word line architecture according to claim 1, wherein said first and second master word lines are respectively allocated a plurality of segments of said sub-word line.

4. The segmented word line architecture according to claim 3, which comprises AND gates connected between said individual master word lines and the associated said sub-word lines.

* * * * *